US00RE46489E

(19) United States
(12) Reissued Patent
Arik et al.

(10) Patent Number: US RE46,489 E
(45) Date of Reissued Patent: Jul. 25, 2017

(54) SYSTEM AND METHOD FOR MOUNTING A COOLING DEVICE AND METHOD OF FABRICATION

(71) Applicant: General Electric Company, Schenectady, NY (US)

(72) Inventors: Mehmet Arik, Uskudar Istanbul (TR); Charles Erklin Seeley, Niskayuna, NY (US); Yogen Vishwas Utturkar, Niskayuna, NY (US); William Edward Burdick, Jr., Niskayuna, NY (US); Kunal Ravindra Goray, Bangalore (IN); Stanton Earl Weaver, Broadalbin, NY (US)

(73) Assignee: General Electric Company, Schenectady, NY (US)

(21) Appl. No.: 14/538,050

(22) Filed: Nov. 11, 2014

Related U.S. Patent Documents

Reissue of:
(64) Patent No.: 8,342,819
Issued: Jan. 1, 2013
Appl. No.: 12/840,554
Filed: Jul. 21, 2010

U.S. Applications:
(62) Division of application No. 11/761,557, filed on Jun. 12, 2007, now abandoned.

(51) Int. Cl.
*H05K 7/20* (2006.01)
*H01L 23/40* (2006.01)
(Continued)

(52) U.S. Cl.
CPC ..... *H01L 23/40* (2013.01); *G06F 1/20* (2013.01); *H01L 23/467* (2013.01);
(Continued)

(58) Field of Classification Search
CPC . F04D 29/626; F04D 29/646; H05K 7/20009; H05K 7/20136–7/20209;
(Continued)

(56) References Cited

U.S. PATENT DOCUMENTS 5,427,642 A * 6/1995 Akiguchi et al. ..... 156/273.3
6,722,581 B2 4/2004 Saddoughi
(Continued)

FOREIGN PATENT DOCUMENTS

EP 1762725 A1 3/2007
WO WO2006114934 A1 11/2006

OTHER PUBLICATIONS

Barton L. Smith and Ari Glezer. The formation and evolution of synthetic jets. Physics of Fluids. vol. 10, No. 9, Sep. 1998, pp. 2281-2297. [retrieved Mar. 13, 2015]. Retrieved from <http://dx.doi.org/10.1063/1.869828>.*
(Continued)

*Primary Examiner* — Sara Clarke
(74) *Attorney, Agent, or Firm* — Ziolkowski Patent Solutions Group, SC; Jean K. Testa

(57) ABSTRACT

A mounting apparatus for a cooling device is disclosed. The mounting apparatus includes a plurality of connectors extending outwardly from the cooling device. The mounting apparatus also includes at least one mounting post coupled to the plurality of connectors and configured to mount the cooling device on a substrate.

18 Claims, 13 Drawing Sheets

(51) Int. Cl.
*G06F 1/20* (2006.01)
*H01L 23/467* (2006.01)

(52) U.S. Cl.
CPC .. *H01L 2924/00* (2013.01); *H01L 2924/0002* (2013.01); *Y10T 29/49002* (2015.01); *Y10T 29/4935* (2015.01); *Y10T 29/5313* (2015.01)

(58) Field of Classification Search
CPC ..... H01L 23/40; H01L 23/467; H01L 2924/0002; Y10T 29/4935; Y10T 29/5313; Y10T 29/49002; G06F 1/20
USPC ..... 417/360, 423.15, 410.1; 361/694, 361/719–721, 695; 239/102.2, 330
See application file for complete search history.

(56) References Cited

U.S. PATENT DOCUMENTS 6,801,430 B1 10/2004 Pokharna ..... 361/695
7,198,250 B2 4/2007 East
7,492,592 B2 * 2/2009 Ye et al. ..... 361/695
2003/0024781 A1 2/2003 Iannuzzelli
2003/0218863 A1 11/2003 Hutchinson et al.
2005/0199282 A1 9/2005 Oleinick et al.
2006/0196638 A1 9/2006 Glezer et al.
2007/0029070 A1 2/2007 Yamamoto et al.
2007/0119573 A1 5/2007 Mahalingam et al.
2009/0086416 A1 4/2009 Ishikawa et al.

OTHER PUBLICATIONS

Hong et al., "On Centerline Distributions of Velocity and Momentum in Synthetic Jet Actuator Flows", 14th Australian Fluid Mechanics Conference, Adelaide University, Adelaide, Australia, 5 pages, Dec. 10-14, 2001, XP-002560596.

PCT/US2008/063618 International Search Report dated Jan. 4, 2010; 9 Pages.

* cited by examiner

SYSTEM AND METHOD FOR MOUNTING A COOLING DEVICE AND METHOD OF FABRICATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is a divisional application of application Ser. No. 11/761,557, filed Jun. 12, 2007.

BACKGROUND

The invention relates generally to thermal management systems, and more particularly to thermal management systems for use in microelectronic devices.

Thermal management is becoming an increasingly significant concern in the microelectronics industry. Non-limiting examples of microelectronic devices include printed circuit board computers, programmable logic controllers (PLCs), operator interface computers, laptop computers, cell phones, personal digital assistants (PDAs), and personal pocket computers. Such devices generate waste heat during normal operation that must be dissipated for desirable performance and reliability of microelectronic components in the device.

Several technologies have been employed to remove heat from microelectronic devices. An example includes forced air cooling via conventional cooling fans and heat sinks. Heat sinks conduct thermal energy away from the devices and transfers the thermal energy to air circulated by cooling fans. However, cooling fans use an undesirable amount of energy, create audible noise and have space limitations.

BRIEF DESCRIPTION

In accordance with an aspect of the invention, a mounting apparatus for a cooling device is provided. The mounting apparatus includes a plurality of connectors extending outwardly from the cooling device. The mounting apparatus also includes at least one mounting post coupled to the plurality of connectors and configured to mount the cooling device on a substrate.

In accordance with another aspect of the invention, a method of mounting a cooling device is provided. The method includes disposing at least one mounting post on a substrate. The method also includes mounting a cooling device on the mounting post by way of a plurality of connectors extending outwardly from the cooling device.

In accordance with another aspect of the invention, a method of fabricating a cooling device is provided. The cooling device includes at least one plate defining a chamber, at least one active material on the at least one plate, and a compliant material within the at least one plate and encompassing the chamber, the compliant material having at least one opening facilitating fluid communication between the chamber and an exterior environment. The method includes disposing an active material on the plate, wherein said disposing comprises at least one selected from the group consisting of dispensing the active material via an automated system, condensate or thermally curing a preformed membrane of active material with the plate via an adhesive, ultraviolet light curing a preformed membrane of active material with the plate via an adhesive, and applying a preformed pressure sensitive tape to the plate.

In accordance with another aspect of the invention, a cooling device is provided. The cooling device includes at least one supporting structure, including an inner surface defining a chamber and having a pair of grooves. The supporting structure also includes at least one opening facilitating fluid communication between the chamber and an exterior environment. The cooling device also includes a pair of flexible plates, each said plate being disposed within one of the pair of grooves.

In accordance with another aspect of the invention, a cooling device is provided. The cooling device includes a supporting frame, including an inner surface defining a chamber and at least one opening facilitating fluid communication between the chamber and an exterior environment. The cooling device also includes a pair of suspended jet plates, each suspended jet plate attached to the supporting frame.

In accordance with another aspect of the invention, a cooling device is provided. The cooling device includes a cup shaped supporting structure that has an inner surface defining a chamber, an orientation plate attached to a base and configured to provide angular orientation, and at least one opening facilitating fluid communication between the chamber and an exterior environment. The cooling device also includes a pair of flexible plates, each said plate being attached to the cup shaped supporting structure via an attachment.

In accordance with another aspect of the invention, a modular cooling device is provided. The modular cooling device includes a pair of flexible discs having at least one opening facilitating fluid communication between the chamber and an exterior environment, and a pair of electrical terminals configured to provide a parallel electrical connection to a second cooling device.

In accordance with another aspect of the invention, a method of mounting a cooling device on a printed circuit board is provided. The method includes disposing a plurality of mounting posts on the cooling device to orient the cooling device at an angle relative to the circuit board and forming a region under the cooling device. The method also includes disposing a plurality of electronic components that do not require cooling in the region under the cooling device.

These and other advantages and features will be more readily understood from the following detailed description of preferred embodiments of the invention that is provided in connection with the accompanying drawings.

DRAWINGS

DETAILED DESCRIPTION

As discussed in detail below, embodiments of the invention include a system and method for mounting a cooling device and a method of fabricating the cooling device. As used herein, the term 'cooling device' refers to a device blowing jet streams into systems such as, but not limited to, a microelectronic assembly and a printed circuit board assembly.

Figure 1:
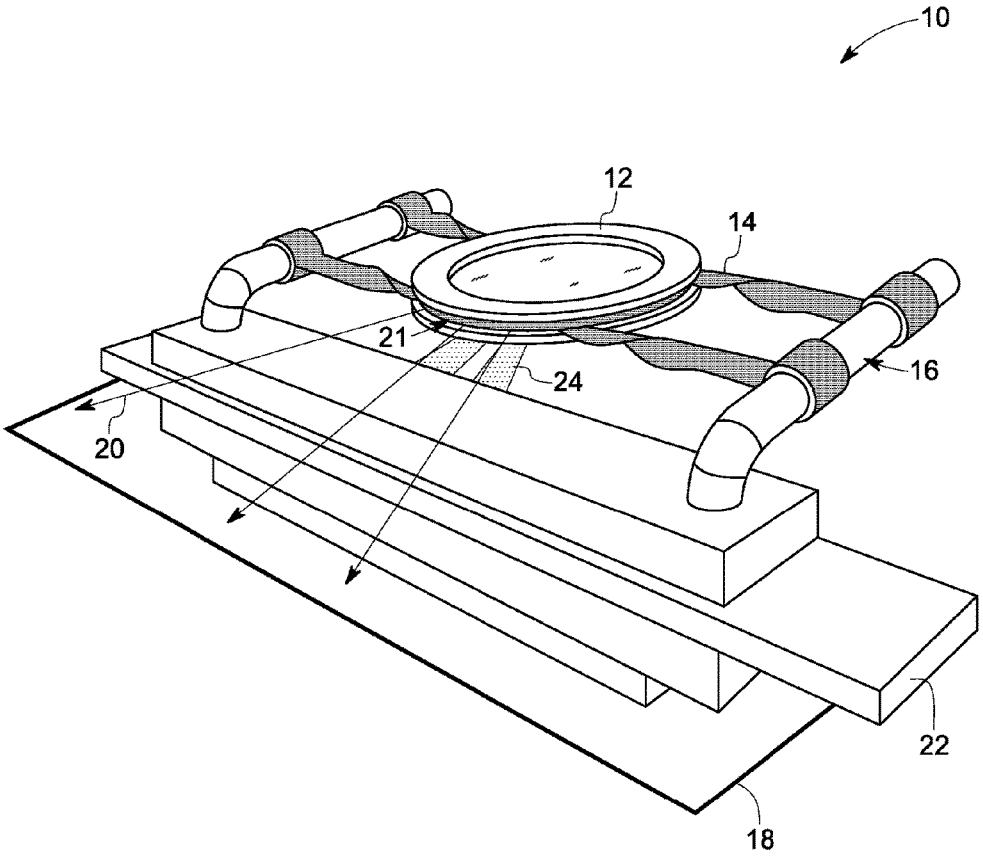
FIG. 1 is a diagrammatic illustration of a mounting apparatus including tendons for mounting a cooling device in accordance with an embodiment of the invention.

Turning now to the drawings, FIG. 1 is a schematic illustration of a mounting apparatus 10 for a cooling device 12. The mounting apparatus 10 includes multiple connectors 14 extending outwardly from the cooling device 12. The mounting apparatus 10 also includes at least one mounting post 16 coupled to the multiple connectors 14. In FIG. 1, two mounting posts 16 are depicted. In a particular embodiment, the mounting posts 16 are stiff and unmovable. The mounting posts 16 enable mounting of the cooling device 12 on a substrate 18. In a particular embodiment, the connectors 14 include a compliant material. In an example, the compliant material includes an elastomeric material. In the illustrated embodiment, the connectors 14 include multiple elastomeric tendons. The connectors 14 may be configured to orient the cooling device 12 at an angle to the substrate 18. The cooling device 12 blows jet streams through an orifice 21 in a direction 20 toward the substrate 18. In a particular embodiment, the substrate 18 is a printed circuit board assembly. The mounting posts 16 may be mounted to the substrate 18 via an integrated connector 22. The cooling device 12 also may include one or more flex connections 24 to provide electrical connection to electronic components.

Figure 2:
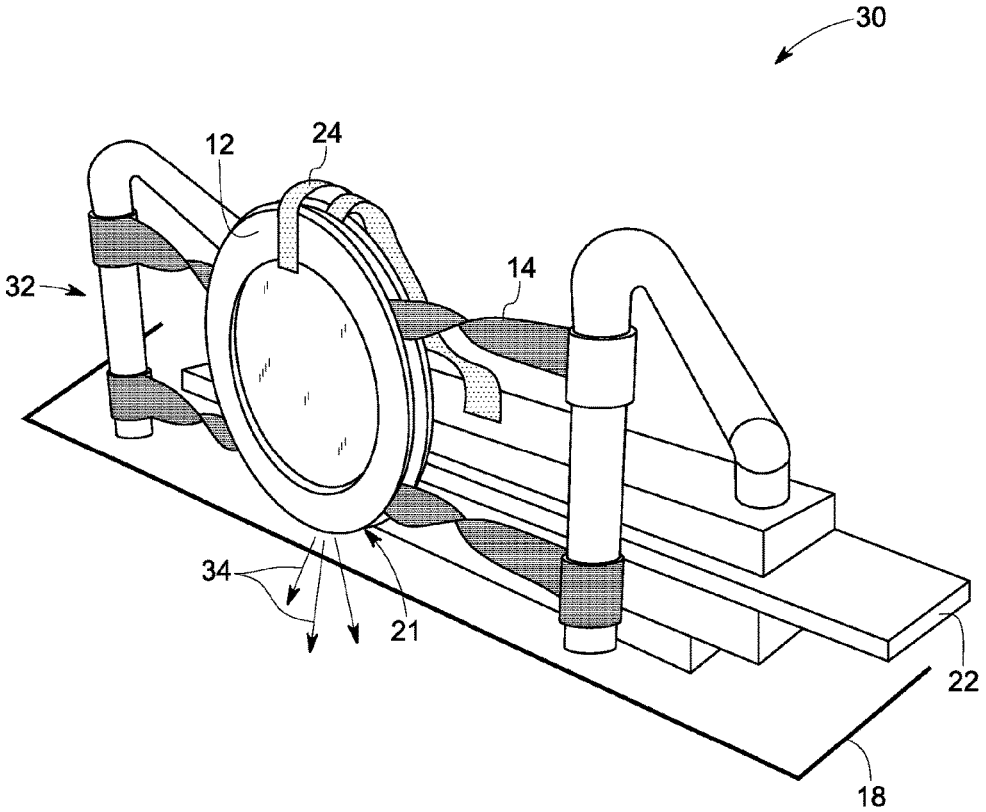
FIG. 2 is a diagrammatic illustration of another mounting apparatus including tendons for mounting a cooling device in a different orientation than the mounting apparatus of FIG. 1.

FIG. 2 is a schematic illustration of a mounting apparatus 30 for a cooling device 12 in FIG. 1 at a vertical orientation. The mounting apparatus 30 includes at least one mounting post 32 disposed in a plane perpendicular to a plane of the substrate 18. Two mounting posts 32 are shown in FIG. 2. Connectors 14 are attached to the mounting post 32 such that the cooling device 12 is mounted in a plane perpendicular to a plane of the substrate 18. This results in jet streams through an orifice 21 blown in a direction 34 toward the substrate 18.

Figure 3:
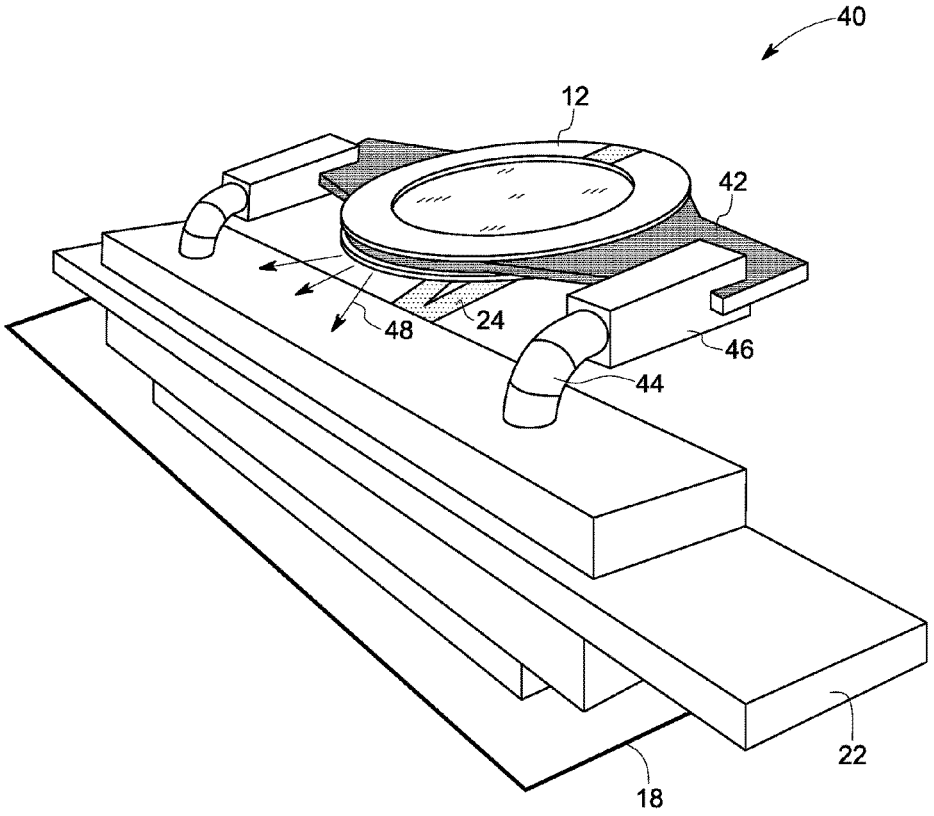
FIG. 3 is a diagrammatic illustration of a mounting apparatus including tabs for mounting a cooling device in accordance with an embodiment of the invention.

FIG. 3 is a schematic illustration of a mounting apparatus 40 for the cooling device 12 in FIG. 1 at an angular orientation with respect to a plane of the substrate 18. The mounting apparatus 40 includes an elastomeric tab 42 extending outwardly from the cooling device 12. One or more mounting posts 44 coupled to the elastomeric tab 42 mount the cooling device 12 at an angle to the substrate 18. Two mounting posts 44 are shown in FIG. 3. A tab pinch clip 46 is attached to the mounting post 44 that clips the elastomeric tab 42 to the mounting post 44. Jet streams are blown in a direction 48 toward the substrate 18. The mounting post 44 is mounted to the substrate 18 via an integrated connector 22. The cooling device 12 also may include one or more flex connections 24 to provide electrical connection to electronic components.

Figure 4:
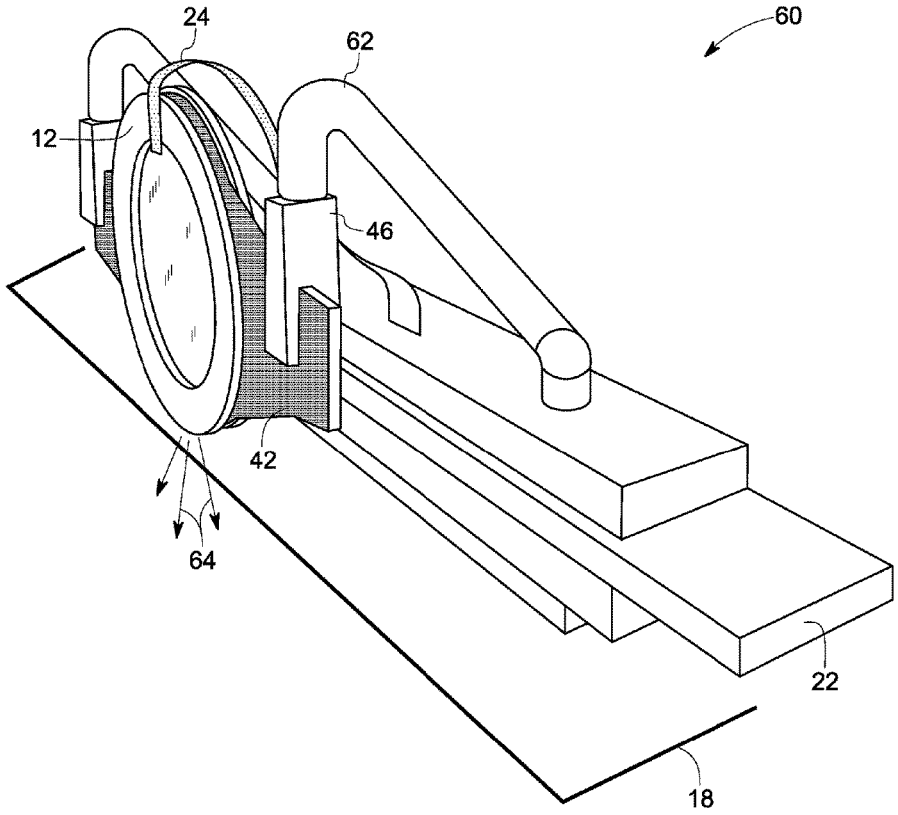
FIG. 4 is a diagrammatic illustration of another mounting apparatus including tabs for mounting a cooling device in a different orientation than the mounting apparatus of FIG. 3.

FIG. 4 is a schematic illustration of a mounting apparatus 60 for the cooling device 12 in FIG. 1 at a vertical orientation using the elastomeric tab 42 in FIG. 3. The mounting apparatus 60 includes at least one mounting post 62 disposed in a plane perpendicular to a plane of the substrate 18. Two mounting posts 62 are shown in FIG. 4. The elastomeric tab 42 is attached to the mounting posts 62 via the tab pinch clips 46 such that the cooling device 12 is mounted in a plane perpendicular to a plane of the substrate 18. This results in jet streams blown in a direction 64 toward the substrate 18.

Figure 5:
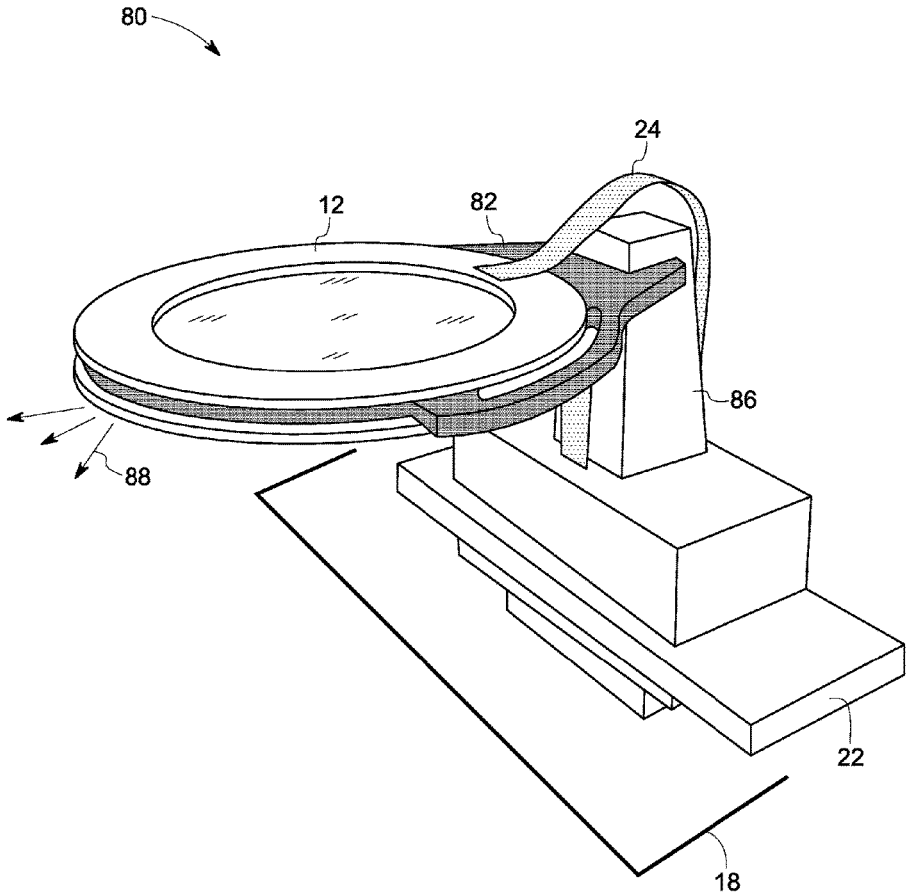
FIG. 5 is a diagrammatic illustration of a mounting apparatus including an E-clip for mounting a cooling device in accordance with an embodiment of the invention.

FIG. 5 schematically illustrates a mounting apparatus 80 for the cooling device 12 in FIG. 1. The mounting apparatus 80 may mount the cooling device 12 in a planar orientation with respect to the substrate 18. The mounting apparatus 80 includes a connector formed in a shape of an E-clip 82 extending outwardly from the cooling device 12. A mounting post 86 coupled to the E-clip 82 mounts the cooling device 12 at an angle to the substrate 18. Jet streams are blown in a direction 88 toward electronic components disposed on the substrate 18. The mounting post 86 is mounted to the substrate 18 via an integrated connector 22. The cooling device 12 also may include one or more flex connections 24 to provide electrical connection to electronic components.

Figure 6:
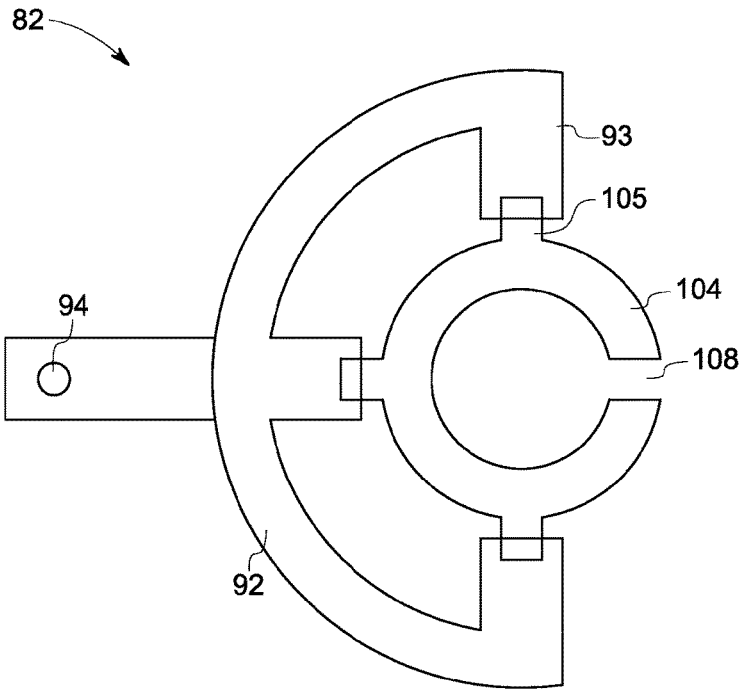
FIG. 6 is a schematic illustration of the E-clip in FIG. 5.

FIG. 6 schematically illustrates the E-clip 82, which may be made of an elastomeric material. The E-clip 82 includes an angularly extending portion 92 that enables mounting of the cooling device 12 to the substrate 18. The angularly extending portion 92 has a fixture 94 that provides mechanical connection to the mounting post 86 (FIG. 5). The angularly extending portion 92 includes inwardly extending clips 93 that receive outwardly directed extensions 105 of the compliant material 104. The compliant material 104 includes an orifice 108 that provides a channel for a jet stream.

Figure 7:
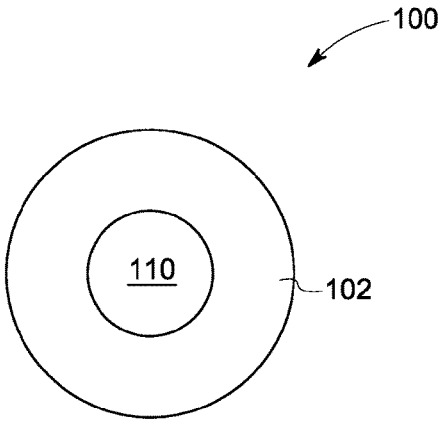
FIG. 7 is a schematic top view of an exemplary cooling device in accordance with an embodiment of the invention.

FIG. 7 is a schematic illustration of a top view of an exemplary cooling device 100. The cooling device 100 includes an active material 110 bonded to a thin plate or disk 102. In a particular embodiment, the active material 110 may be electrically stimulated to cause an out of plane deformation resulting in a jet of air through an orifice (not shown).

Examples of a suitable active material 110 include piezoelectric material, magnetostrictive material (magnetic fields from coils attract/oppose one another), shape-memory alloy, and motor imbalance (motor with a mass imbalance creates oscillatory motion). Within the subset of piezoelectric materials, suitable active materials include bimorph piezoelectric configurations, where two piezo layers are energized out of phase to produce bending; thunder configurations, where one piezo layer is disposed on a pre-stressed stainless steel shim; buzzer element configurations, where one piezo layer is disposed on a brass shim; and MFC configurations, where a piezo fiber composite on a flexible circuit is bonded to a shim. The active material 110 may also incorporate a ceramic material.

Figure 8:
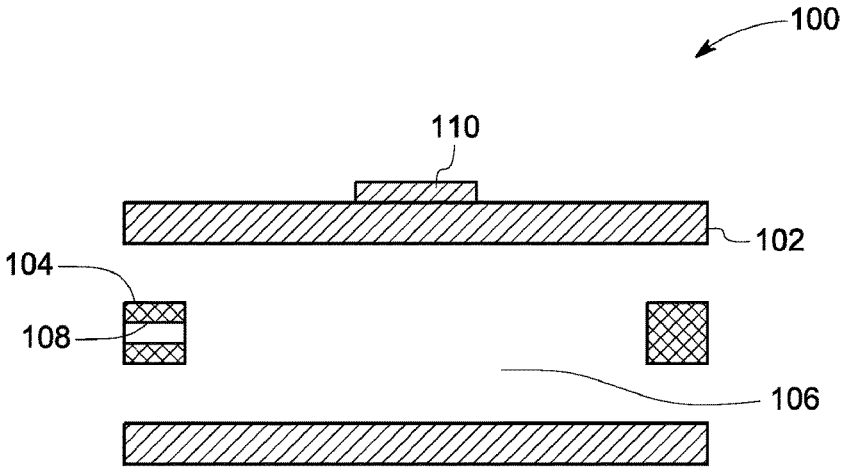
FIG. 8 is a cross-sectional view of the cooling device in FIG. 6.

FIG. 8 is a cross-sectional view of an exemplary cooling device 100 in FIG. 7. A compliant material 104 is positioned within the thin disk or plate 102 and encompasses a chamber 106. In an example, the compliant material 104 includes an elastomeric material. An active material 110 as referenced in FIG. 7 is bonded to at least one of the plates or disks 102. In a particular embodiment, the active material 110 is bonded to the plate or disk 102 in one assembly step, then the combination of 110 and 102 are positioned in a pattern via a pick and place automated system. The compliant material 104 is further dispensed at a controlled rate onto the plate or disk 102 such that a desirable thickness is obtained and the cooling device 100 may be tuned to a desired structural frequency. The compliant material 104 also includes an orifice or opening 108 (FIG. 6) that provides a channel for a jet stream between the chamber 106 and an exterior environment. A stress on the plate or disk 102 created by the active material 110 in response to an electrical stimulus, causes an outward flexing, resulting in a volume change in the chamber 106 and an influx of ambient air into the chamber 106, and then inwardly, thereby ejecting the ambient air from the chamber 106 via the orifice 108. It should be appreciated that the active material 110 may be positioned on an inner surface of the plate or disk 102 instead of, as shown in FIG. 8, an outer surface.

Figure 9:
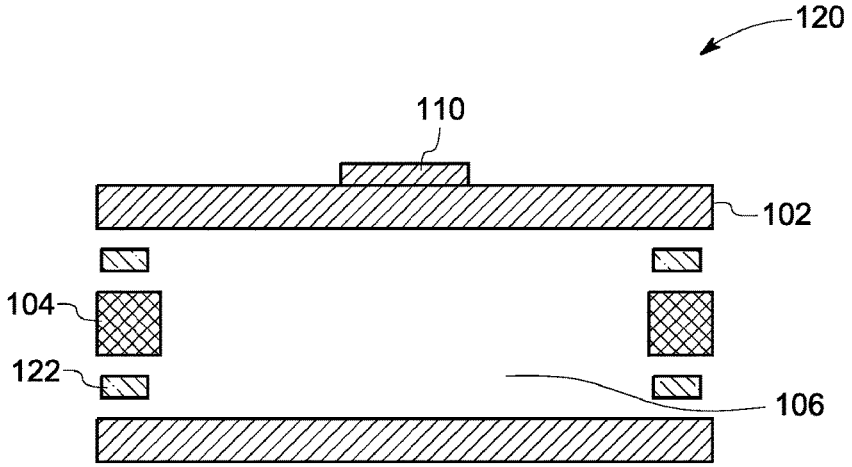
FIG. 9 is a cross-sectional view of another cooling device including a layer of adhesive in accordance with an embodiment of the invention.

In another illustrated embodiment of the invention as described in FIG. 9, a cross-sectional view of a cooling device 120 including a layer of adhesive 122 is depicted. A compliant material 104 as referenced in FIGS. 6 and 8 is positioned within the plate or disk 102 and encompasses the chamber 106. Active material 110 is bonded to least one of the plate or disk 102. The compliant material 104 is attached to the plate or disk 102 through an adhesive 122. An example of the adhesive 122 includes an epoxy or pressure sensitive adhesive. In a particular embodiment, the adhesive 122 is a preformed membrane of material, or a dispensable material, that is thermally curable with the plate or disk 102. In another embodiment, the adhesive 122 is a preformed membrane, or a dispensable material, that is curable by ultraviolet light with the plate or disk 102. It should be appreciated that the active material 110 may be positioned on an inner surface of the plate or disk 102 instead of, as shown in FIG. 9, an outer surface.

Figure 10:
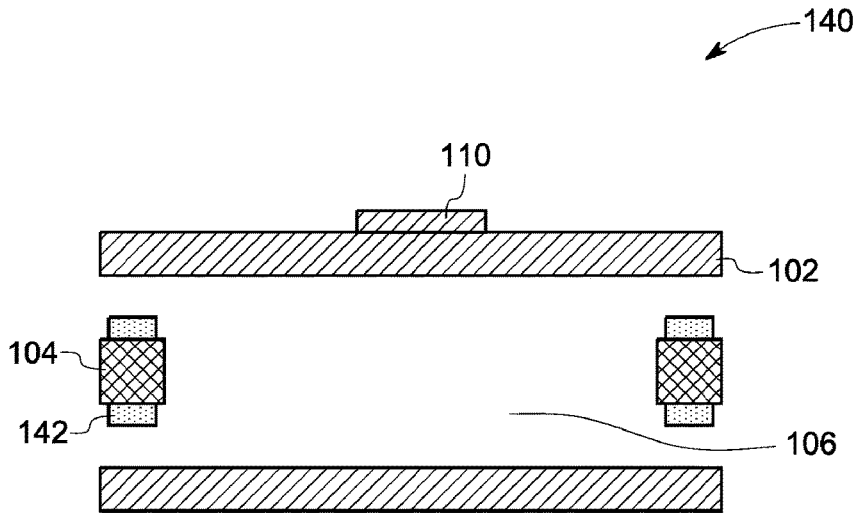
FIG. 10 is a cross-sectional view of another cooling device including a pressure sensitive tape in accordance with an embodiment of the invention.

FIG. 10 is a cross-sectional view of an exemplary cooling device 140 including a pressure sensitive adhesive (PSA) 142. The compliant material 104 is positioned within the plate or disk 102 and encompasses the chamber 106. The compliant material 104 is a preformed membrane of material, or a dispensable material, that is adhered to at least one of the plate or disk 102 by applying a preformed PSA 142 between the plate or disk 102 and the compliant material 104. It should be appreciated that the active material 110 may be positioned on an inner surface of the plate or disk 102 instead of, as shown in FIG. 10, an outer surface.

Figure 11:
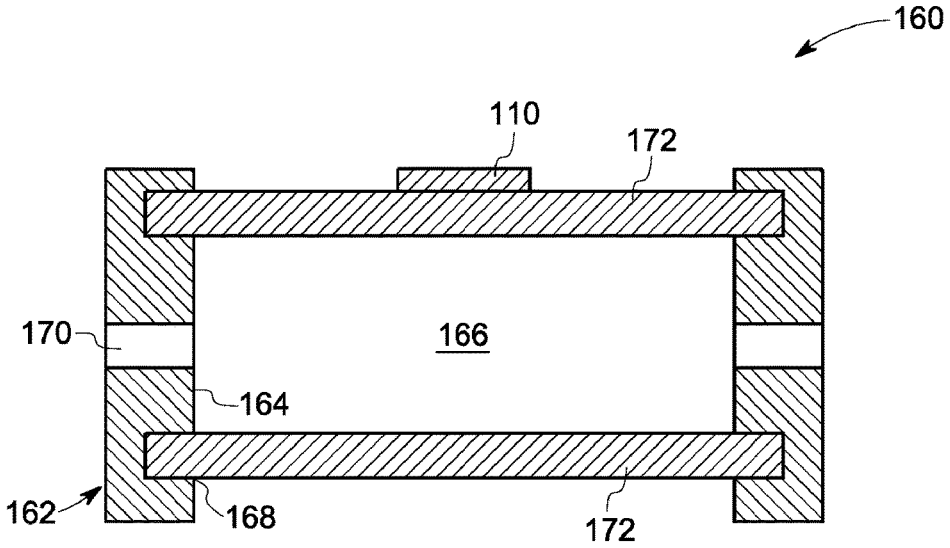
FIG. 11 is a cross-sectional view of another cooling device having a mechanical structure attached to a plate in accordance with an embodiment of the invention.

FIG. 11 is a cross-sectional view of another exemplary cooling device 160. The cooling device 160 includes at least one supporting structure 162 having an inner surface 164 defining a chamber 166. In a particular embodiment, the supporting structure 162 is metallic. In another embodiment, the supporting structure 162 is made of a composite resin. The inner surface 164 also includes a pair of grooves 168. Further, the supporting structure 162 includes at least one opening or orifice 170 facilitating flow of jet stream between the chamber 166 and an exterior environment. A pair of flexible plates 172 is attached to the supporting structure 162 through the pair of grooves 168. The supporting structure 162 enables altering a structural dynamic frequency response of the cooling device 160. The structural frequency of the cooling device 160 may be optimized and tuned equal to about a Helmholtz frequency, resulting in a reduction in noise. It should be appreciated that the active material 110 may be positioned on an inner surface of the plate or disk 172 instead of, as shown in FIG. 11, an outer surface.

Figure 12:
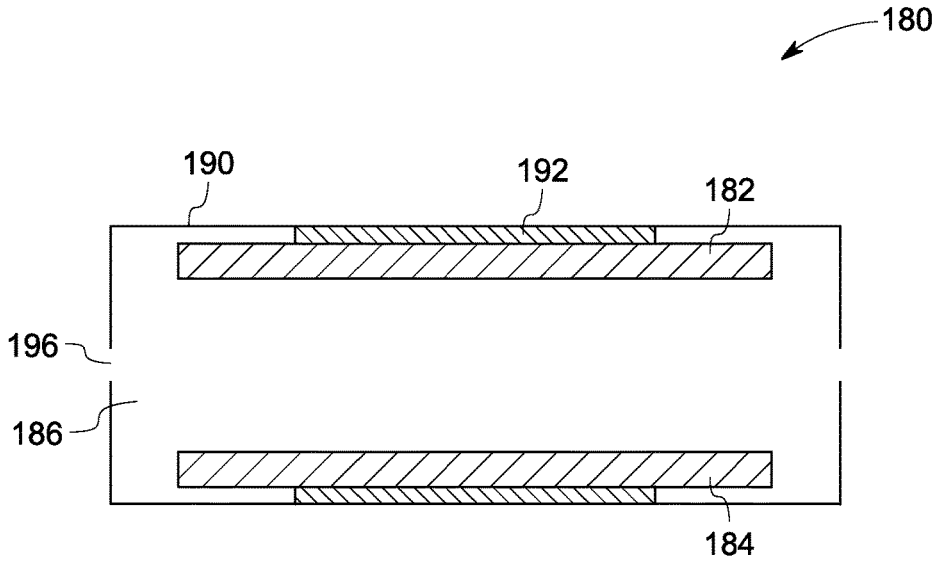
FIG. 12 is a cross-sectional view of another cooling device in accordance with an embodiment of the invention.
Figure 13:
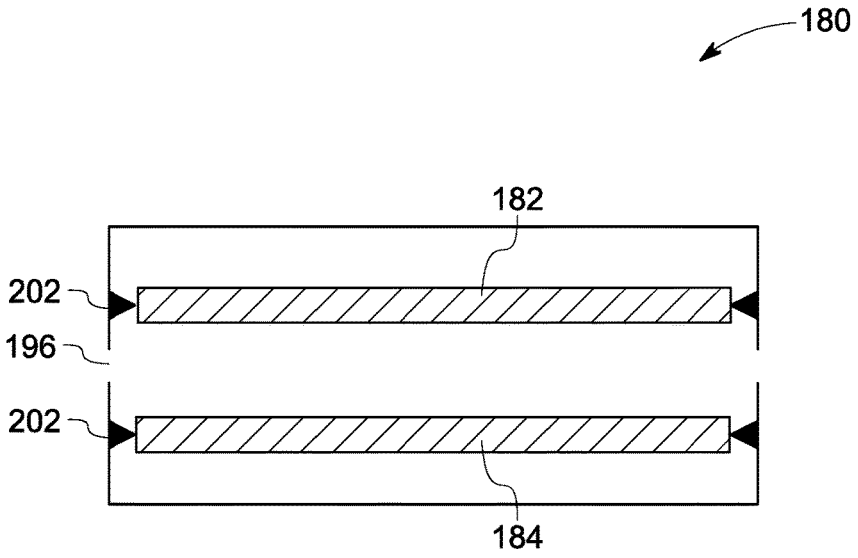
FIG. 13 is a cross-sectional view of another cooling device in accordance with an embodiment of the invention.

FIGS. 12 and 13 are cross-sectional views of a cooling device 180. The cooling device 180 includes an upper suspended jet plate 182 and a lower suspended jet plate 184 separated by a chamber 186. In a particular embodiment, the upper jet plate 182 is bonded to an upper portion 188 of a supporting frame 190 by a compliant adhesive 192. Similarly, the lower jet plate 184 is bonded to a lower portion 194 of the supporting frame 190 by the compliant adhesive 192. The supporting frame 190 includes multiple orifices 196 that allow a flow of jet. The suspended jet plate system 180 allows for minimal damping of motion resulting in a free flow of the jet.

FIG. 13 is a cross-sectional view of another exemplary configuration of the cooling device 180 in FIG. 12 including cantilevers 202. The cantilevers 202 attach the upper jet plate 182 and the lower jet plate 184 to the supporting frame 190 eliminating a need of an adhesive.

Figure 14:
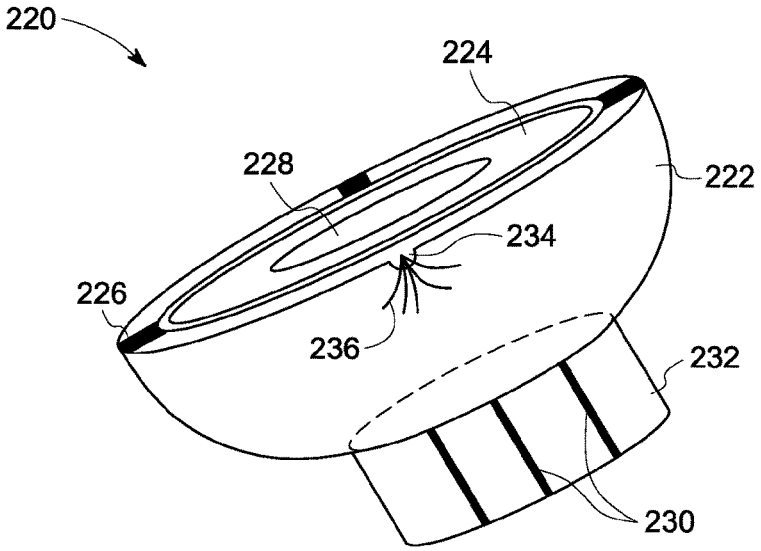
FIG. 14 is a diagrammatic illustration of another cooling device in accordance with an embodiment of the invention.

FIG. 14 is a diagrammatic illustration of another exemplary cooling device 220. The cooling device 220 includes a cup shaped supporting structure 222. In a particular embodiment, the cup shaped supporting structure 222 is made of plastic. The cooling device 220 includes flexible plates 224 attached to the supporting structure 222 via an attachment 226. In a particular embodiment, the plates or disks 224 are metal discs. In another embodiment, the attachment 226 is a metal attachment. In yet another embodiment, the attachment 226 may be a V-shaped notch. An active material 228 is disposed on the plate or disks 224. The supporting structure 222 includes multiple leads 230 for electrical connection and support. In one embodiment, the structure 222 includes two leads for electrical connection and a lead for support. An orientation plate 232 is attached to a base of the supporting structure 222 to provide an angular orientation of a jet. An orifice 234 in the supporting structure 222 is aligned with an orifice in the plates 224 to enable a free flow of jet 236.

Figure 15:
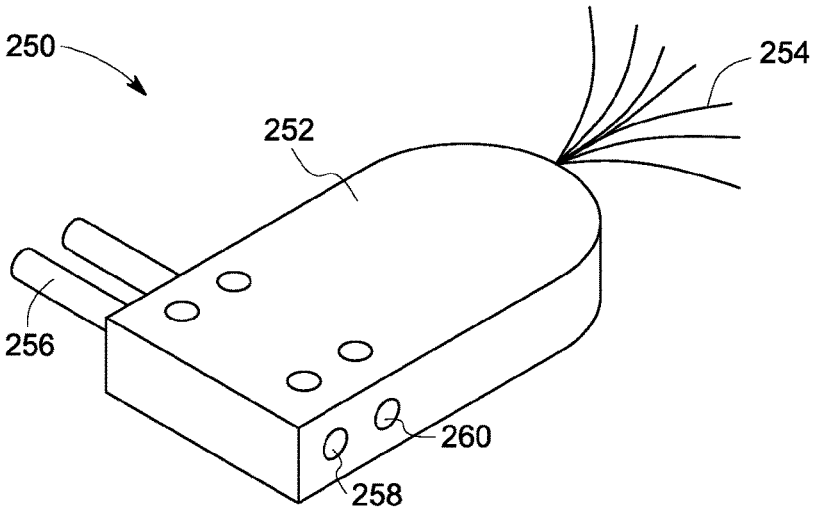
FIG. 15 is a diagrammatic illustration of another cooling device in accordance with an embodiment of the invention.

FIG. 15 is a diagrammatic illustration of a modular cooling device 250. The modular cooling device 250 includes flexible discs 252 with an orifice to allow a flow of jet 254. In a particular embodiment, the discs 252 are sandwich shaped plastic discs. Leads 256 may be provided for electrical connection to a power source. Further, a positive terminal 258 and a negative terminal 260 may be provided for parallel connection to multiple cooling devices. The modular cooling device 250 provides for a more intense jet resulting in greater cooling. In a particular embodiment, at least two cooling devices may be electrically connected in parallel.

Figure 16:
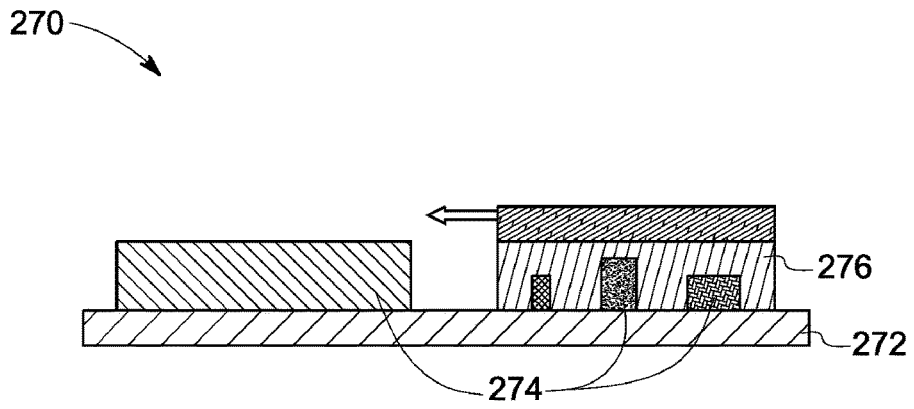
FIG. 16 is a cross-sectional view of another mounting configuration in accordance with an embodiment of the invention.

FIG. 16 is a cross-sectional view of an exemplary mounting configuration for a cooling device 270. The cooling device 270 may be mounted on a printed circuit board 272 having multiple electronic components 274 via a compliant adhesive 276. In particular embodiment, the compliant adhesive 276 has a curing temperature of less than about 85° C.

Figure 17:
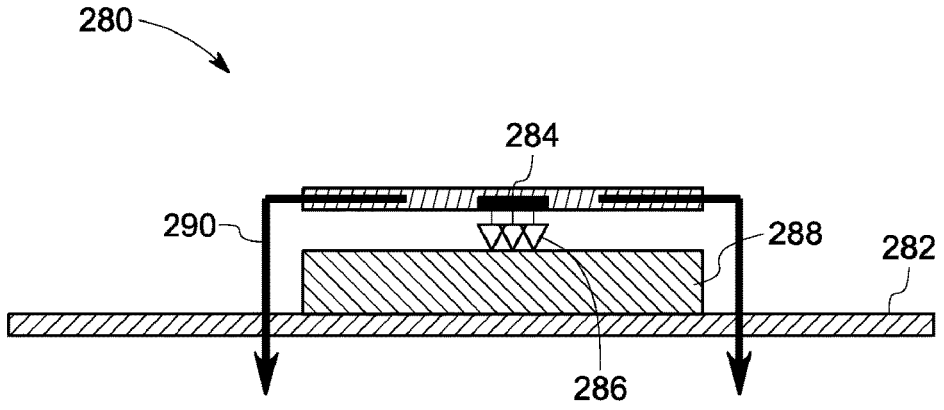
FIG. 17 is a cross-sectional view of another mounting configuration in accordance with an embodiment of the invention.

FIG. 17 is a cross-sectional view of another exemplary mounting configuration for a cooling device 280 onto a printed circuit board 282. The cooling device 280 includes an orifice 284 that allows a jet 286 to flow on an electronic component 288. The cooling device 280 is mounted using a through board clip 290 on either side.

Figure 18:
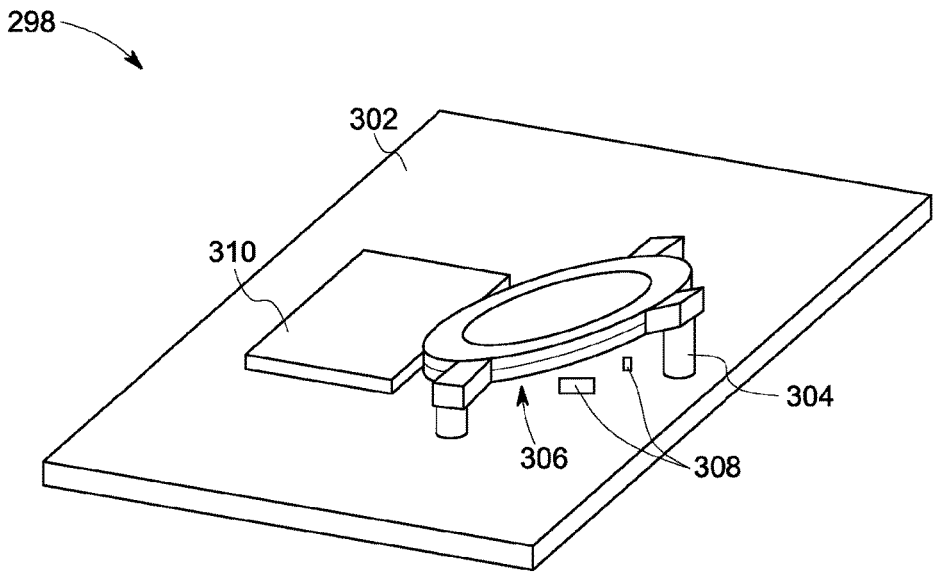
FIG. 18 is a cross-sectional view of another mounting configuration including mounting posts in accordance with an embodiment of the invention.

FIG. 18 a cross-sectional view of another exemplary mounting configuration 298 for a cooling device 300 onto a printed circuit board 302. Multiple mounting posts 304 are attached to the cooling device 300 such that the cooling device 300 is aligned at an angle to the printed circuit board 302 such as to form a region 306 under the cooling device 300. This enables mounting of electronic components 308 that do not require cooling in the region 306 resulting in an effective usage of available area on the circuit board 302. An electronic component 310 that requires cooling is further mounted on the printed circuit board 302 so as to receive a jet flow from the cooling device 300.

Figure 19:
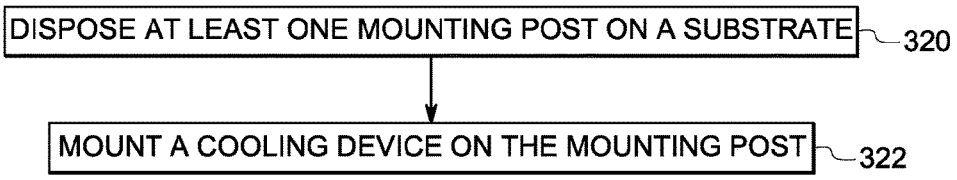
FIG. 19 illustrates process steps for mounting a cooling device on a substrate in accordance with an embodiment of the invention.

FIG. 19 illustrates steps involved in a method for mounting a cooling device on a substrate. The method includes disposing at least one mounting post on the substrate in step 320. A cooling device is mounted on the mounting post via multiple connectors extending outwardly from the cooling device in step 322. In a particular embodiment, the multiple connectors are formed by extending a compliant material outwardly. In one embodiment, the multiple connectors are formed by extending multiple tendons outwardly. In another embodiment, the multiple connectors are formed by extending multiple tabs. In yet another embodiment, the multiple connectors are formed by extending an E-clip. In an exemplary embodiment, the cooling device may also be mounted on the mounting post at an angle transverse to a plane of the substrate.

The various embodiments of a system and method for mounting a cooling device and a method of fabrication described above thus provide a way to achieve a convenient and efficient means of installing a cooling device into various applications. These techniques and systems also allow for highly efficient microelectronic assemblies due to improved packaging.

Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. For example, the use of a PSA tape to attach an elastomeric material to a plate with respect to one embodiment can be adapted for use with an elastomeric tab connector described with respect to another. Similarly, the various features described, as well as other known equivalents for each feature, can be mixed and matched by one of ordinary skill in this art to construct additional systems and techniques in accordance with principles of this disclosure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while embodiments of the invention describe the use of multiple mounting posts for use with a single cooling device, it should be appreciated that a single mounting post with branching mounting arms may be used. Further, although the mounting posts are described as being stiff and unmovable, it should be appreciated that the mounting posts may be stiff but pliable to enable one to tune particular cooling devices to a specific angle relative to the plane in which the substrate exists. Alternatively, the mounting posts may incorporate a mechanism by which the angle for any particular cooling device can be manually indexed. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A mounting apparatus for a cooling device, comprising:

[a plurality of connectors] *at least one connector* extending outwardly from the cooling device and configured to orient the cooling device at an angle transverse to a substrate; and at least one mounting post coupled to the [plurality of connectors] *at least one connector* and configured to mount the cooling device on the substrate, wherein the cooling device comprises an active material and the active material is electrically stimulated to cause an out of plane deformation of the cooling device resulting in a jet stream of air blown in a direction towards the substrate.

2. The mounting apparatus of claim 1, wherein [each of the plurality of connectors] *the at least one connector* comprises a compliant material.

3. The mounting apparatus of claim 2, wherein the compliant material comprises an elastomeric material.

4. The mounting apparatus of claim 1, wherein the [plurality of connectors] *at least one connector* comprises a plurality of tendons.

5. The mounting apparatus of claim 1, wherein the [plurality of connectors] *at least one connector* comprises a plurality of tabs.

6. The mounting apparatus of claim 1, wherein the [plurality of connectors] *at least one connector* is formed integral into an E-clip mounting apparatus.

7. The mounting apparatus of claim 1, wherein the [plurality of connectors] *at least one connector* is configured to mount the cooling device in a plane perpendicular to a plane of the substrate.

8. The mounting apparatus of claim 1, wherein the substrate is a printed circuit board assembly.

9. A method of mounting a cooling device, comprising:

disposing at least one mounting post on a substrate; and mounting a cooling device on the mounting post at an angle transverse to a plane of the substrate by way of [a plurality of connectors] *at least one connector* extending outwardly from the cooling device, wherein the cooling device comprises an active material and the active material is electrically stimulated to cause an out of plane deformation of the cooling device resulting in a jet stream of air blown in a direction towards the substrate.

10. The method of claim 9, wherein the mounting by way of [a plurality of connectors] *at least one connector* comprises extending a compliant material outwardly to form the [plurality of connectors] *at least one connector*.

11. The method of claim 10, wherein the extending comprises forming a plurality of tendons.

12. The method of claim 10, wherein the extending comprises forming a plurality of tabs.

13. The method of claim 10, wherein the extending comprises forming an E-clip.

14. A method of mounting a cooling device on a printed circuit board comprising:

disposing a plurality of mounting posts on the cooling device to orient the cooling device at an angle relative to the circuit board and forming a region under the cooling device; and disposing a plurality of electronic components that do not require cooling in the region under the cooling device, wherein the cooling device comprises an active material and the active material is electrically stimulated to cause an out of plane deformation of the cooling device resulting in a jet stream of air blown in a direction towards the circuit board.

*15. A cooling system for a printed circuit board comprising:*

*a printed circuit board having a plurality of electronic components mounted thereon, wherein at least one of the plurality of electronic components does not require cooling; and*

*a cooling device coupled to a plurality of mounting posts, wherein the plurality of mounting posts orient the cooling device at an angle to the printed circuit board and form a region under the cooling device;*

*wherein the at least one of the plurality of electronic components not requiring cooling is disposed in the region under the cooling device.*

*16. A cooling system for a printed circuit board comprising:*

*a printed circuit board having at least one electronic component mounted thereon; and*

*at least one through-board clip insertable and mateable with the printed circuit board so as to extend therethrough; and*

*a cooling device coupled to the at least one through-board clip to secure the cooling device in-place relative to the at least one electronic component, the cooling device comprising an active material that is electrically stimulated to cause an out of plane deformation of the cooling device resulting in a jet stream of air being blown out therefrom;*

*wherein the through-board clip disposes the cooling device above the at least one electronic component and orients the cooling device at an angle transverse to the printed circuit so as to cool the at least one electronic component.*

*17. A cooling system for a circuit board comprising:*

*a printed circuit board having a plurality of electronic components mounted thereon; and*

*a cooling device attached to the printed circuit board with an adhesive;*

*wherein the cooling device comprises an active material and the active material is electrically stimulated to cause an out of plane deformation of the cooling device resulting in a jet stream of air being blown out therefrom;*

*wherein the cooling device is attached to the printed circuit board such that it is at an angle transverse to the printed circuit board; and*

*wherein at least one of the plurality of electronic components is encased within the adhesive.*

*18. The cooling system of claim 17 wherein the cooling device is a piezoelectric cooling device.*

* * * * *